(12) United States Patent
Malametz (10) Patent No.: US 7,024,933 B2
(45) Date of Patent: *Apr. 11, 2006

(54) INTERNALLY SHOCK CAGED SERPENTINE FLEXURE FOR MICRO-MACHINED ACCELEROMETER

(75) Inventor: David L. Malametz, Lynnwood, WA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/102,222

(22) Filed: Apr. 8, 2005

(65) Prior Publication Data

US 2005/0183503 A1    Aug. 25, 2005

Related U.S. Application Data

(62) Division of application No. 10/736,330, filed on Dec. 15, 2003.

(51) Int. Cl.
    *G01P 15/02*    (2006.01)
(52) U.S. Cl. ................... 73/514.32; 73/514.36
(58) Field of Classification Search ............. 73/514.32, 73/514.36, 514.38, 504.12, 504.14
    See application file for complete search history.

(56) References Cited

U.S. PATENT DOCUMENTS

| 5,025,346 A | 6/1991 | Tang et al. |
| 5,399,980 A | 3/1995 | Rashford |
| 5,447,067 A | 9/1995 | Biebl et al. |
| 5,542,295 A | 8/1996 | Howe et al. |
| 5,880,369 A | 3/1999 | Samuels et al. |
| 6,223,598 B1 | 5/2001 | Judy |
| 6,282,960 B1 | 9/2001 | Samuels et al. |
| 6,318,174 B1 | 11/2001 | Schmiesing et al. |
| 6,494,096 B1 | 12/2002 | Sakai et al. |
| 6,522,445 B1 | 2/2003 | Kleytman |
| 6,635,940 B1 | 10/2003 | Milligan |
| 6,705,166 B1 | 3/2004 | Leonardson |
| 6,805,008 B1 | 10/2004 | Selvakumar et al. |

FOREIGN PATENT DOCUMENTS

| WO | WO 02/12905 A1 | 2/2002 |
| WO | WO 02/084303 A1 | 10/2002 |

*Primary Examiner*—John E. Chapman
(74) *Attorney, Agent, or Firm*—Charles J. Rupnick, Attorney at Law (57) ABSTRACT

An apparatus and method for sensing accelerations and other forces. The apparatus having a capacitance pick-off force sensor having a proof mass that is suspended relative to a relatively stationary frame by a plurality of serpentine suspension members having internal caging. The device provides easily implemented fabrication modification for trading-off between input range and pick-off sensitivity by altering etching periods of the serpentine suspension members. The input range and pick-off sensitivity can be traded-off by enlarging or reducing the quantity of elongated flexure fingers forming the serpentine suspension member. Different ones of the elongated flexure fingers are optionally formed with different thicknesses, whereby the serpentine suspension member exhibits a spring rate that progressively increases as it is compressed by in-plane motion of the proof mass relative to the relatively stationary frame.

20 Claims, 4 Drawing Sheets

INTERNALLY SHOCK CAGED SERPENTINE FLEXURE FOR MICRO-MACHINED ACCELEROMETER

This application is a Divisional of and claims priority benefit of copending parent U.S. patent application Ser. No. 10/736,330 filed in the name of David L. Malametz on Dec. 15, 2003, the complete disclosure of which is incorporated herein by reference.

FIELD OF THE INVENTION

The present invention relates to force and acceleration measurement devices and methods, and in particular to micro-machined electromechanical sensor (MEMS) force and acceleration measurement devices employing circular ring diaphragm flexures in a small, rugged device having high pick-off sensitivity.

BACKGROUND OF THE INVENTION

The manufacture of micro-machined electromechanical sensor (MEMS) force and acceleration measurement devices is generally well-known for many different applications. Some applications require the device to provide very accurate measurements, while other applications require the device to withstand extreme shock and vibration environments.

Some applications require the measurement of force in extreme dynamic environments. For example, if a gun-launched projectile requires on-board acceleration sensing, the accelerometer providing the sensing must have a high pickoff sensitivity, and must be capable of operating in a high-g range with high-g shock survivability characteristics for shock loads in the range of 16,000 to 20,000 g's or more. Capacitive-sensing MEMS accelerometer devices are often used for operation in such high-g environments because they are capable of a small overall geometry that is ideal for high-g sensor packages that operate in a minimum space.

Other applications require the measurement of minimal forces in the micro-g range. These applications may be even more sensitive to even minimal shock and vibration environments as the suspension structure supporting the reaction mass must be responsive to these very minimal input loads.

The emphasis on high pickoff sensitivity in minimum space encourages the use comb-type capacitive pickoff sensors having large quantities of pickoff electrodes arranged on both a moveable proof mass and a fixed base with the opposing pickoff electrodes overlapping like the teeth of two combs. Maximizing pickoff sensitivity requires maximizing the capacitance between the overlapping electrodes. Capacitance may be maximized by increasing travel of the proof mass. But this must be accomplished without overstressing the proof mass suspension. Typically, shock stops are strategically placed to limit the travel of the proof mass so as to protect the proof mass suspension from overstress. Limiting the travel of the proof mass also protects the overlapping electrodes from coming into harmful contact.

Capacitance also may be maximized by increasing the number of interacting sensing electrodes. However, the drive toward smaller package sizes forces a tradeoff between increasing the number of sensing electrodes and effectively locating sufficient shock stops to effectively limit the travel of the proof mass.

Additionally, an accelerometer in a gun-launch application must also exhibit low cross-axis sensitivity characteristics. Today's designers are challenged when faced with a need to contain all of these features in a low cost, small size accelerometer device.

One solution is described in published U.S. patent application Ser. No. 10/117,303, "SMALL SIZE, HIGH CAPACITANCE READOUT SILICON BASED MEMS ACCELEROMETER," filed Apr. 5, 2002, in the name of Ronald B. Leonardson, now U.S. Pat. No. 6,705,166, the complete disclosure of which is incorporated herein by reference, which uses overlapping concentric continuous annular electrodes on opposing base and proof mass plates with the proof mass suspended by an annular flexure.

Another attempted solution is described by Biebl, et al. in U.S. Pat. No. 5,447,067, "ACCELERATION SENSOR AND METHOD FOR MANUFACTURING SAME," the complete disclosure of which is incorporated herein by reference, which relies on elongated proof mass suspension flexures to provide extended proof mass travel without damage to the suspension. Unfortunately, the Biebl, et al. solution ignores the need to fit the sensor in a small package.

SUMMARY OF THE INVENTION

The present invention provides an inexpensive force measurement device having high pick-off sensitivity in a high-G input range which can operate in a high-G shock environment by providing, in contrast to the prior art devices and methods, a capacitance pick-off force sensor having a proof mass that is suspended relative to a relatively stationary frame by a plurality of serpentine suspension members having internal caging. The device of the present invention provides easily implemented fabrication modification for trading-off between input range and pick-off sensitivity by altering etching periods of the serpentine suspension members. Alternatively, the input range and pick-off sensitivity can be traded-off by enlarging or reducing the quantity of elongated flexure fingers forming the serpentine suspension member. Alternatively, different ones of the elongated flexure fingers are formed with different thicknesses, whereby the serpentine suspension member exhibits a spring rate that progressively increases as it is compressed by in-plane motion of the proof mass relative to the relatively stationary frame.

According to one aspect of the invention, the serpentine flexure is formed of a plurality of spaced-apart elongated flexure members formed through the thickness of a substrate as substantially planar elements and being relatively narrow as measured crosswise to their longitudinal axes such that the elongated flexure members are resiliently flexible in a single direction that is substantially crosswise to their respective longitudinal axes, and a plurality of relatively short interconnecting members arranged crosswise to the longitudinal axes of the elongated flexure members and interconnecting opposite ends of alternate pairs of the elongated flexure members in a serpentine configuration.

According to another aspect of the invention, the means for internally-caging of the spaced-apart elongated flexure members is an extension formed on one end of one or more of the interconnecting members and extending a part of the distance between one of the members interconnecting one pair of the spaced-apart elongated flexure members and an end of a next adjacent members interconnecting a next adjacent pair of the spaced-apart elongated flexure members.

According to another aspect of the invention, at least one of the frame and proof mass includes means for externally caging the serpentine flexure that includes a promontory mass that is sized to span a part of the distance between an edge thereof and one of the crosswise interconnecting members.

According to another aspect of the invention, one or more of the plurality of spaced-apart elongated flexure members is thicker than one or more others of the elongated flexure members as measured along the single direction that is substantially crosswise to their respective longitudinal axes, whereby a spring rate associated with one of the elongated flexure members is different from a spring rate associated with a different one of the elongated flexure members. Optionally, the spring rate of one or more of the serpentine flexures progressively increases, or otherwise changes, between the proof mass and the frame.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 1 and 2 illustrate the serpentine flexure of the invention, wherein

DETAILED DESCRIPTION OF PREFERRED EMBODIMENT

In the Figures, like numerals indicate like elements.

Figure 1:
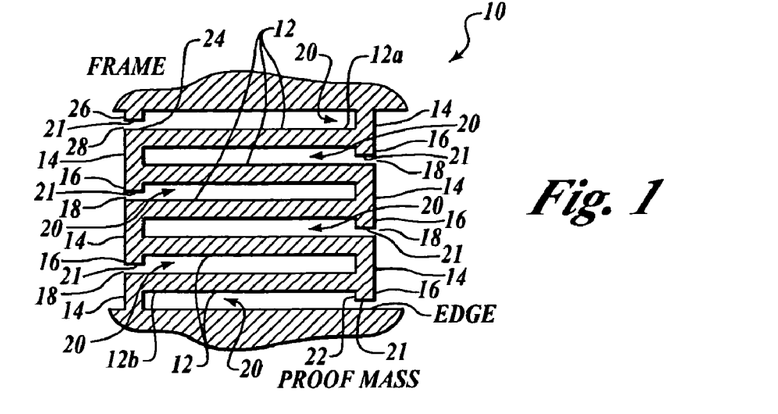
FIG. 1 illustrates the serpentine flexure in a relaxed state.

The present invention is an apparatus and method for an inexpensive force measurement device having high pickoff sensitivity in a high-g input range which can survive and operate in both high-g and low-g shock and vibration environments. As is shown in FIG. 1 and described in more detail below, the present invention is thus embodied as an internally-caged serpentine flexure that is operable in only one axis, i.e., in the input axis of the sensor. Accordingly, the flexure of the invention is formed of a plurality of elongated flexure members or "fingers" formed through the thickness of a substrate as substantially planar elements arranged substantially crosswise to an operational axis of the flexure and spaced-apart like rungs of a ladder, the elongated flexure fingers being interconnected in pairs at alternating ends in a switch-back serpentine configuration by short interconnecting members arranged crosswise to the longitudinal axes of the elongated flexure fingers with the elongated flexure fingers being relatively narrow as measured crosswise to their longitudinal axes, the flexure length and thickness being determined as a function of the application. For example, relatively shorter and thicker fingers cause the flexures to be stiffer for measurements in a high-g input range, and relatively longer and thinner fingers cause the flexures to be more pliable for measurements in a low-g input range. One end of a first of the elongated flexure fingers is spaced away from a fixed or stationary frame and interconnected thereto by one of the short interconnecting members arranged crosswise thereto, and an opposite end of a last one of the elongated flexure fingers is spaced away from a relatively movable reaction or "proof" mass and interconnected thereto by another one of the short interconnecting members arranged crosswise thereto.

The flexure thus resembles a ladder spanning between the fixed or stationary frame and the relatively movable proof mass wherein the two sidepieces are separated by elongated flexure fingers arranged like the ladder rungs, with parts of the two sidepieces broken out between alternating pairs of rungs on alternating sides of the ladder-like flexure structure. The relatively long length of the elongated flexure fingers as compared with their width as measured crosswise their longitudinally axes in the plane of the substrate causes the elongated flexure fingers to be resiliently flexible leaf-type springs. The resulting flexure operates like a spring and is alternatively described as a spring formed of a plurality of spaced-apart elongated leaf-type springs interconnected by hairpin turns at alternating ends.

Accordingly, the proof mass is moveable toward or away from the relatively stationary frame by flexing of the resiliently flexible elongated flexure fingers alternately collapsing and expanding of the spaces between the alternating spaced-apart non-connected ends of the elongated flexure fingers.

Additionally, the present invention is embodied having internal caging. Accordingly, one or more of the short crosswise members interconnecting alternating pairs of the elongated flexure fingers includes a short extension on one end that spans a part of the distance between one of the interconnected pair of flexure fingers and a next adjacent pair of interconnected flexure fingers, whereby the distance is foreshortened between one pair of interconnected flexure fingers and the next adjacent pair spaced-apart therefrom. Particularly, the short extension on the end of the short crosswise member interconnecting one pair of flexure fingers is spaced apart from the short crosswise member interconnecting the next adjacent pair of interconnected flexure fingers by a small distance that is less than the larger distance by which adjacent pairs of interconnected flexure fingers are spaced apart. The small distance between adjacent short crosswise interconnecting members is caused to be a distance that permits the adjacent pairs of interconnected elongated flexure fingers to travel towards one another while limiting the travel sufficiently to avoid overstress of the elongated flexure fingers and resulting damage.

In continuation of the internal caging, the short crosswise member interconnecting a last of the pair of interconnected flexure fingers at one end of the serpentine flexure, that is adjacent to but spaced away from an edge of either the stationary frame or the relatively movable proof mass, includes one of the short extensions that is structured to be spaced apart by a small distance from the edge so that travel towards the edge by the end pair of interconnected elongated flexure fingers is limited to substantially the same small distance of travel to which adjacent pairs of interconnected flexure fingers are limited by the short extensions on other crosswise interconnecting members. The small distance between the short extension on the short crosswise interconnecting member and the edge is caused to be a distance that permits the last of the pair of interconnected flexure fingers at the end of the serpentine flexure to travel towards the edge while limiting the travel sufficiently to avoid overstress of the elongated flexure fingers and resulting damage.

Additionally, the edge of the other one of either the stationary frame or the relatively movable proof mass, that is at the opposite end of the serpentine flexure from the final crosswise interconnecting member having the short extension toward the edge, is caused to include a small extension or promontory mass spanning a part of the distance between the edge and the serpentine flexure opposite a final crosswise member interconnecting a final pair of elongated flexure fingers at the opposite end of the serpentine flexure. The small extension or promontory mass is caused to span a distance that permits this last of the pair of interconnected flexure fingers at the end of the serpentine flexure to travel towards this other edge while limiting the travel sufficiently to avoid overstress of the elongated flexure fingers and resulting damage.

Figure 2:
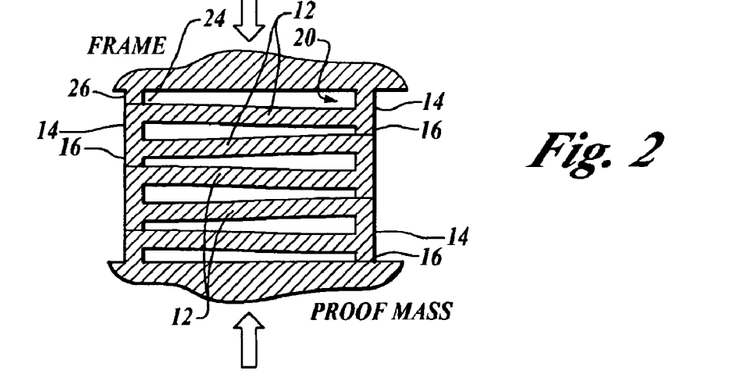
FIG. 2 illustrates the serpentine flexure in a second compressed state at the end of its permissible travel.

FIGS. 1 and 2 illustrate the serpentine flexure of the invention, wherein FIG. 1 illustrates the serpentine flexure in a relaxed state, and FIG. 2 illustrates the serpentine flexure in a second compressed state at the end of its permissible travel. Accordingly, the invention is embodied as a serpentine flexure 10 spanning a distance between a fixed or stationary frame and a relatively movable reaction or proof mass and interconnecting them, wherein the flexure 10 resembles a ladder having two alternately broken sidepieces separated by a plurality of substantially planar elongated flexure fingers 12 substantially aligned with the spaced-apart opposing edges of the frame and proof mass. The flexure 10 is formed integrally with the frame and proof mass through the thickness of a single substrate. The elongated flexure fingers 12 are relatively thin as measured crosswise to their longitudinally axes in the plane of the substrate as compared with their elongated length and depth through the full thickness of the substrate causes the elongated flexure fingers to be resiliently flexible leaf-type springs. However, the relative length and thickness of the flexure fingers 12 is determined as a function of the application, with relatively shorter and thicker flexure fingers 12 for stiffer response to a high-g input, and relatively longer and thinner flexure fingers 12 for more pliable response to a low-g input, whereby the flexure fingers 12 may be in the extreme so thin and long as to have essentially no resistance to in-plane loading of the proof mass so that the device is responsive to even the slightest input.

According to one embodiment of the invention, all the flexure fingers 12 of the serpentine flexure 10 are formed having substantially the same uniform cross-sectional area, whereby the flexure fingers 12 all exhibit substantially the same spring rate when the serpentine flexure 10 is compressed or expanded. When the serpentine flexure 10 is integrally formed in a silicon substrate with the frame and proof mass, the features: elongated flexure fingers 12 and the short crosswise interconnecting members 14 with their short extensions 16, are micromachined using conventional microelectromechanical system, or "MEMS," fabrication techniques, such as etching and laser cutting. The etching is, for example, a conventional reactive ion etching (RIE) or a conventional deep reaction ion etching (DRIE) technique, as are well-known in the art, whereby extremely deep and straight-sided cuts are possible for forming the substantially planar elongated flexure fingers 12.

The elongated flexure fingers 12 are interconnected at alternating ends in a switch-backed serpentine configuration by a plurality of short interconnecting members 14 arranged crosswise to the longitudinal axes of the elongated flexure fingers 12. One end 12a of a first of the elongated flexure fingers 12 is spaced away from a fixed or stationary frame and interconnected thereto by one of the short interconnecting members 14 arranged crosswise thereto. An opposite end 12b of a last one of the elongated flexure fingers 12 is spaced away from the relatively movable proof mass and interconnected thereto by another one of the short interconnecting members 14 arranged crosswise thereto. As a result of this structure, the flexure 10 operates along an operational axis that is oriented substantially crosswise to the longitudinal axes of the elongated flexure fingers 12 like a serpentine spring having a plurality of spaced-apart elongated leaf-type springs interconnected by hairpin turns at alternating ends. Accordingly, the proof mass is moveable toward or away from the relatively stationary frame by flexing of the resiliently flexible elongated flexure fingers 12 and thereby alternately collapsing and expanding of the spaces between their alternating spaced-apart non-connected ends.

Additionally, one or more or even all of the short crosswise members 14 interconnecting alternating pairs of the elongated flexure fingers 12 includes internal caging embodied, by example and without limitation, as a small promontory mass or short extension 16 on one or both ends that spans a part of the distance between one of the flexure fingers 12 and a next adjacent one of the interconnected flexure fingers 14, whereby the distance is foreshortened between adjacent interconnected flexure fingers 14. Particularly, the short extension 16 on the end of the short crosswise member 14 interconnecting one pair of flexure fingers 12 is spaced apart by a small distance 18 from the short crosswise member 14 interconnecting the next adjacent pair of interconnected flexure fingers 12. The small distance 18 between adjacent short crosswise interconnecting members 14 is caused to be a distance that permits the adjacent pairs of interconnected elongated flexure fingers 12 to travel towards one another, while limiting the travel sufficiently to avoid overstress of the elongated flexure fingers 12 and resulting damage. Accordingly, the small distance 18 between adjacent crosswise interconnecting members 14 is less than the larger distance 20 by which adjacent pairs of interconnected flexure fingers 12 are spaced apart. Optionally, the end surfaces 21 of the crosswise member extensions 16 are substantially planar and angled to mate flush with the planar surface of the opposing elongated flexure fingers 12 that also form the opposing end surface of the next adjacent crosswise interconnecting member 14.

The internal caging is optionally embodied in the short crosswise member 14 interconnecting a last of the pair of interconnected flexure fingers 12 at one end 22 of the serpentine flexure 10 that is adjacent to but spaced away from a substantially planar edge of either the stationary frame or the relatively movable proof mass (shown). The last short crosswise member 14 therefore includes one of the short extensions 16 that is structured to be spaced apart by a small distance from the proof mass edge so that travel towards the proof mass by the end pair of interconnected elongated flexure fingers 12 is limited to substantially the same small distance of travel 18 to which adjacent pairs of interconnected flexure fingers 12 are limited by the short extensions 16 on other crosswise interconnecting members 14. The small distance 18 between the short extension 16 on the short crosswise interconnecting member 14 and the edge of the proof mass is caused to be a distance that permits the last of the pair of interconnected flexure fingers 12 at the end 22 of the serpentine flexure to travel towards the proof mass edge, while limiting the travel sufficiently to avoid overstress of the elongated flexure fingers 12 and resulting damage.

Additionally, the edge of the proof mass or the stationary frame (shown) that is at the opposite second end 24 of the serpentine flexure 10 is caused to include a small extension or promontory mass 26 that is sized to span a part of the distance between the frame edge and a final crosswise member 14 interconnecting a final pair of the elongated flexure fingers 12. The small promontory mass 26 is sized to span a distance that permits this final pair of interconnected flexure fingers 12 at the end of the serpentine flexure 10 to travel towards this other edge, while limiting the travel sufficiently to avoid overstress of the elongated flexure fingers 12 and resulting damage. By example and without limitation, the small promontory mass 26 is extended toward the last flexure finger 12 a distance that is sized to space its end apart by a small distance 28 from the last flexure finger 12 that is less than the distance 20 by which adjacent pairs of interconnected flexure fingers 12 are spaced apart and is approximately the same as the small distance 18 by which the short extensions 16 on the ends of the short crosswise members 14 are spaced apart from the next adjacent short crosswise member 14, as discussed herein.

As indicated by the arrows, FIG. 2 illustrates the serpentine flexure 10 in a second fully compressed state at the end of its travel as permitted interference between the short interconnecting members 14 and the short extensions 16 of adjacent interconnecting members 14. As explained above and illustrated in FIG. 2, the resiliently flexible elongated flexure fingers 12 flex toward one another in a serpentine spring manner when a load is applied to the proof mass in the direction of the relatively stationary frame and the serpentine flexure 10 collapses. The relatively delicate resiliently flexible elongated flexure fingers 12 are protected from over stress by internal caging embodied, by example and without limitation, as the plurality of short interconnecting members 14.

Accordingly, under compression the elongated flexure fingers 12 are sufficiently flexible to bend each toward the adjacent one with the alternating ends, the ends that are not constrained by the interconnected crosswise members 14, able to contact an end of the next adjacent flexure finger 12 or the edge of the respective frame or proof mass. The larger distances 20 by which adjacent pairs of interconnected flexure fingers 12 are spaced apart are thus compressed at the unconstrained ends and the flexure 10 partially collapses in the plane of the substrate. When the serpentine flexure 10 is embodied having the short extensions 16 on the ends of the short crosswise members 14, the short extensions 16 extend a short way between each unconstrained end of an elongated flexure finger 12 and the end of the next adjacent flexure finger 12. The alternating pairs of elongated flexure fingers 12 are thus constrained from completely collapsing into one another at one end by the short extensions 16 on the ends of the interconnected crosswise members 14. As discussed above, the length by which the extensions 16 shorten the distance 20 by which the flexure fingers are permitted to collapse is sized to limit the travel sufficiently to avoid overstress of the elongated flexure fingers 12 and resulting damage.

As discussed herein, the end surfaces 21 of the crosswise member extensions 16 are optionally substantially planar and angled to mate flush with the planar surface of the opposing end surface of the next adjacent crosswise interconnecting member 14 that is formed by the opposing elongated flexure finger 12. The planar mating surfaces result in flush contact that protects the mating components from mutual damage.

The expansion and collapse of the elongated flexure fingers 12 are controlled crosswise to the serpentine flexure 10 in the plane of the substrate by the columnar stiffness of flexure fingers 12 and interconnecting members 14 which are rendered substantially rigid by their relatively short length. Out-of-plane expansion and collapse of the elongated flexure fingers 12 are controlled by the planar stiffness of the elongated flexures 12 being formed through the full thickness of the substrate.

Figure 3:
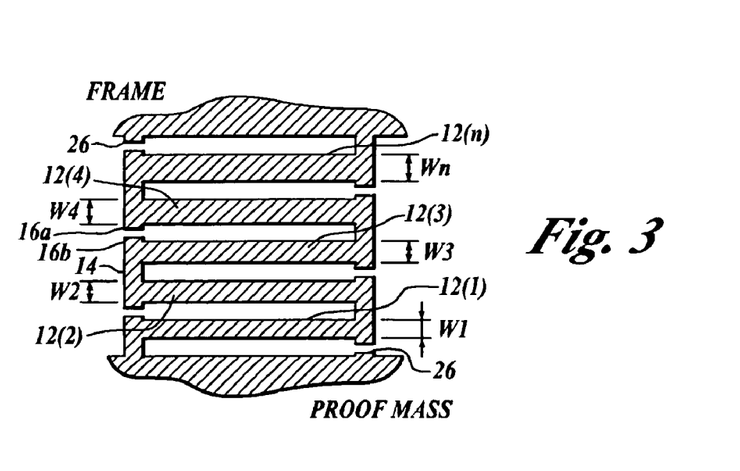
FIG. 3 illustrates the invention embodied as a progressive resistance serpentine flexure arranged in a relaxed state.

FIG. 3 illustrates the invention embodied as a progressive resistance serpentine flexure 30 arranged in a relaxed state. The structure and operation of the progressive resistance serpentine flexure 30 is substantially as described herein for the serpentine flexure 10 illustrated in FIGS. 1, 2. In contrast to the elongated flexure fingers 12 of the serpentine flexure 10, which are formed having substantially the same uniform cross-sectional area so that they all exhibit substantially the same spring rate when the serpentine flexure 10 is compressed or expanded, the elongated flexure fingers 12(1), 12(2), 12(3), 12(4) ... 12(n), collectively 12(1)–12(n), are formed having one or more different respective widths W1, W2, W3, W4 ... W1–Wn, collectively W1–Wn, as measured crosswise their longitudinally axes in the plane of the substrate. The different flexure widths W1–Wn cause the different resiliently flexible flexures 12(1)–12(n) to exhibit different spring rates when the serpentine flexure 30 is compressed or expanded during operation. For example, the different flexure widths Wx become progressively either thinner or thicker (shown) in order of distance from the proof mass and the serpentine flexure 30 exhibits a progressively increasing or "stiffening" spring rate as the progressively wider flexure fingers 12(1)–n12(n) are progressively collapsed toward the frame when the proof mass is moved toward the frame in response to an applied acceleration or other load.

Alternatively, the different flexure widths W1–Wn become progressively either thinner or thicker in order of distance from the proof mass and the frame. For example, the respective widths W1–Wn of the flexure fingers 12(1)–12(n) become progressively thicker from thinner at both the proof mass and the frame toward thicker at the center so that the serpentine flexure 30 exhibits a higher spring rate, i.e., lesser stiffness, at its extreme ends where it is coupled to the proof mass and frame and exhibits a progressively lower spring rate, i.e., greater stiffness toward its center. According to another embodiment of the invention, the respective widths W1–Wn of the flexure fingers 12(1)–12(n) become progressively thinner from thicker at both the proof mass and the frame toward thinner at the center so that the serpentine flexure 30 exhibits a lower spring rate, i.e., greater stiffness, at its extreme ends where it is coupled to the proof mass and frame and exhibits a progressively higher spring rate, i.e., lesser stiffness toward its center.

According to one embodiment of the invention as illustrated in FIG. 3, the short extensions 16 are present on both ends of the interconnecting members 14 so that the means for internally shock caging the serpentine flexure 10 is provided by short extensions 16a, 16b on opposing end surfaces of adjacent interconnecting members 14. Furthermore, one of the shorter extensions 16a, 16b is provided on the members 14 interconnecting the first and last pairs of flexure fingers 12(1), 12(2) and 12(4), 12(n) with a cooperating small extension or promontory mass 26 provided on the opposing edges of the frame and proof mass opposite.

The present invention is optionally embodied as an apparatus and method for an inexpensive force measurement device having high pickoff sensitivity in a high-G input range which can survive and operate in a high-G shock environment. As is shown in FIG. 4 and described in more detail below, the present invention is thus embodied as an internally-caged serpentine flexure that is compressible and extensible in only one axis, i.e., in the input axis of the sensor, while being stiff crosswise to the input axis both in the plane of the substrate of which the sensor is fabricated and out-of-plane.

Figure 4:
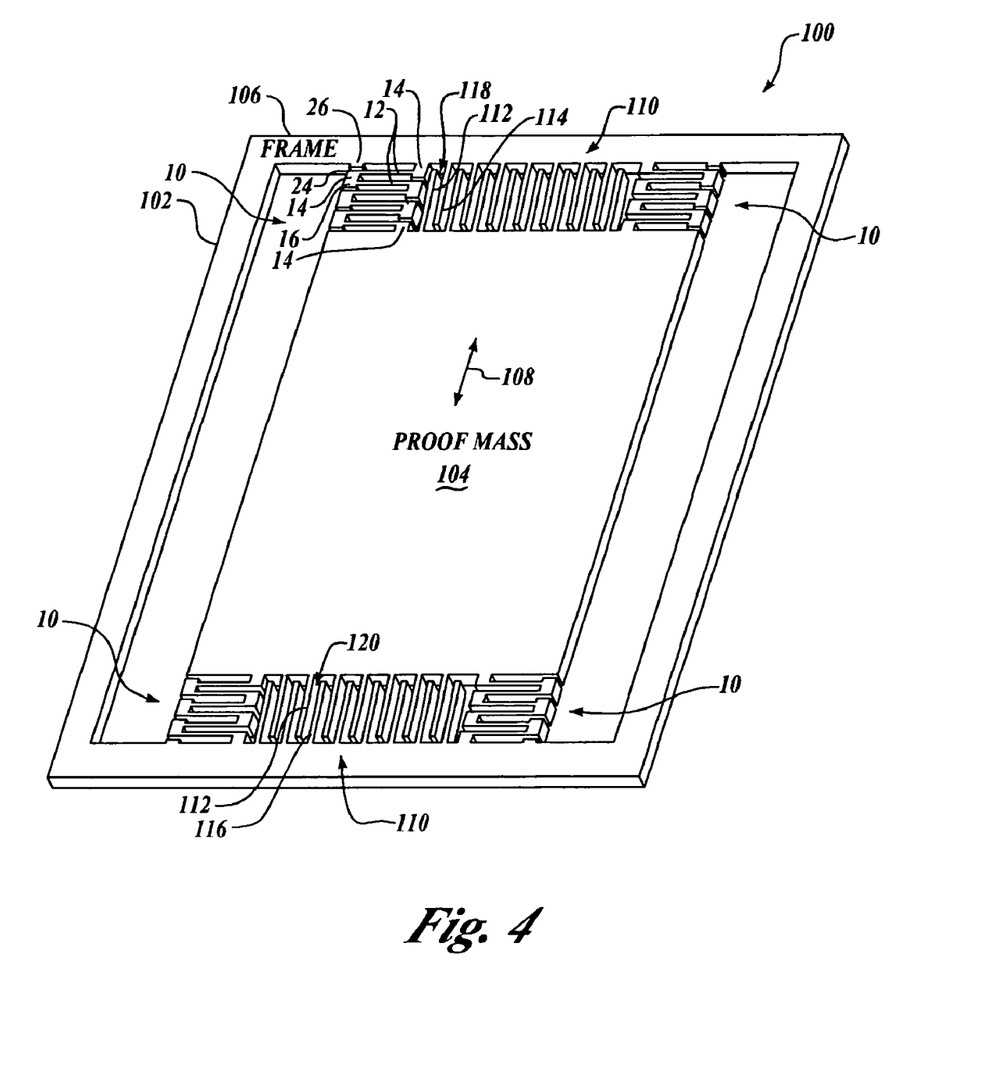
FIG. 4 illustrates the serpentine flexure of the invention embodied in a single in-plane directional sensor.

FIG. 4 illustrates the invention embodied in a single in-plane directional sensor 100. The micromechanical elements or features are etched out of a single-crystal silicon substrate 102. A relatively movable reaction or proof mass 104 is connected to a fixed or stationary frame 106 formed in the remaining portion of the silicon substrate 102 by a plurality of the serpentine flexures 10, as described herein, which suspend opposite ends of the proof mass 104 in a balanced configuration. The axis of sensitivity of the sensor 100, as indicated by the arrow 108, lies in the plane of the silicon substrate 104. As described herein, the serpentine flexure 10 includes a plurality of elongated flexure fingers 12 of substantially planar configuration arranged so that the thickness of the elongated flexure fingers 12, i.e., as measured along the sensor's sensitive axis 108, is small in comparison to their length measured in the plane of the substrate crosswise to the sensitive axis 108 and depth which is substantially that of the thickness of the substrate 102. The plurality of serpentine flexure 10 are arranged at the extreme outer edges, i.e., the corners, of the proof mass 104 in a balanced configuration in the gaps between the proof mass 104 and the frame 106. Each of the serpentine flexures 10 is integrally coupled to an outer edge the proof mass 104 by one of the interconnected crosswise members 14 at one end of the last finger flexure 12 on one end of the serpentine flexure 10, and to an inner edge of the frame 106 by another one of the interconnected crosswise members 14 at a same end of the last finger flexure 12 on opposite end of the serpentine flexure 10.

The relative stiffness of the serpentine flexures 10 crosswise to the sensitive axis, both in-plane and out-of-plane, and the relative flexibility along the sensitive axis together permit the flexures 10 to collapse or expand along the sensitive axis, whereby the proof mass 104 is moveable along the sensitive axis 108 in response to an applied force, such as an acceleration. As described herein, the short extensions 16 on the ends of the short crosswise members 14 interconnecting alternate pairs of the elongated flexure fingers 12 internally cage the flexure 10 and limit the travel of the individual elongated finger flexures 12 so that their travel is sufficiently limited to avoid overstress of the elongated flexure fingers 12 and resulting damage.

Additionally, the edge of the proof mass 104 or the stationary frame 106 (shown) that is at the unconstrained end 24 of the final flexure finger 12 is formed with the small extension or promontory mass 26 that is sized to span a part of the distance between the inner frame edge and a final crosswise member 14 interconnecting a final pair of the elongated flexure fingers 12. The small promontory mass 26 is sized to permit this last of the pairs of interconnected flexure fingers 12 at the end of the serpentine flexure 10 to travel towards this inner frame edge while limiting the travel sufficiently to avoid overstress of the elongated flexure fingers 12 and avoid resulting damage. By example and without limitation, the small promontory mass 26 is extended toward the last flexure finger 12 a distance that is sized to space its end apart by the small distance 28 (shown in FIG. 1) from the last flexure finger 12 that is less than the distance 20 (shown in FIG. 1) by which adjacent pairs of interconnected flexure fingers 12 are spaced apart and is approximately the same as the small distance 18 (shown in FIG. 1) by which the short extensions 16 on the ends of the short crosswise members 14 are spaced apart from the next adjacent short crosswise member 14, as discussed herein.

In addition to protecting itself, each flexure 10 also protects the other flexures 10 suspending the proof mass 104. By limiting its own travel in compression, each flexure 10 simultaneously limits the expansive travel of the flexure 10 positioned on the opposite end of the proof mass that must expand as the protective flexure 10 collapses. Furthermore, when distributed to suspend the proof mass in a balanced configuration, as illustrated in FIG. 4, each flexure 10 protects the other flexures 10 by limiting or eliminating rotation of the proof mass 104 and resultant rotational moments that would be applied to the flexures 10.

According to one embodiment of the invention, when configured as an acceleration measurement device or accelerometer, the single in-plane directional sensor 100 is formed with a plurality of comb-type capacitive pickoff sensors 110 of a type that are well-known in the art and described, for example, by Leonardson in U.S. patent application Ser. No. 10/117,303, "SMALL SIZE, HIGH CAPACITANCE READOUT SILICON BASED MEMS ACCELEROMETER," which is incorporated herein by reference, and by Biebl, et al. in U.S. Pat. No. 5,447,067, "ACCELERATION SENSOR AND METHOD FOR MANUFACTURING SAME," which is incorporated herein by reference. Accordingly, the proof mass 104 is formed with several finger-shaped electrodes 112 arranged so that their longitudinal directions extend along the sensitive axis 108 of the sensor 100, which is substantially perpendicular to the longitudinal direction of the resilient elongated flexure fingers 12. Each of the finger-shaped electrodes 112 is doped so as to be electrically conductive and form a capacitor in combination with a corresponding doped finger-shaped electrode 114, 116, which extend along the opposing inner edges of the frame 106 on opposite ends of the proof mass 104 and are arranged so that their longitudinal directions extend along the sensitive axis 108 of the sensor 100 and parallel with the several finger-shaped electrodes 112 extending from the proof mass. All of the electrodes 114 are electrically connected to each other at one side of the proof mass 104, and all of the electrodes 116 are electrically connected to each other at the other side of the proof mass 104. Interdigital capacitors 118, 120 are thus formed at each side of the proof mass 104 between the finger-shaped proof mass electrodes 112 and each of the finger-shaped frame electrodes 114, 116 respectively. So arranged, these capacitors 118, 120 and the respective capacitances thereof change as a consequence of a change in the overlap of the conductor areas which occurs given a movement of the proof mass 104 along the sensitive axis 108. This change in the capacitances ensues oppositely at the respective capacitors 118, 120 disposed at the opposite sides of the proof mass 104. The two capacitors 118, 120 thus respectively change their capacitance in opposite directions given an acceleration of the substrate, and thus an excursion of the proof mass 104 in the plane of the silicon substrate 102 perpendicular to the longitudinal axes of the resilient elongated finger flexures 12 of the serpentine suspension flexures 10. The acceleration is proportional to the difference between the capacitance changes of the two capacitors 118, 120. The sensor 100 is operated, by example and without limitation, by a circuit of the type described by Rashford in U.S. Pat. No. 5,399,980, "CAPACITIVE MEASURING CIRCUIT," the complete disclosure of which is incorporated herein by reference.

Figure 5:
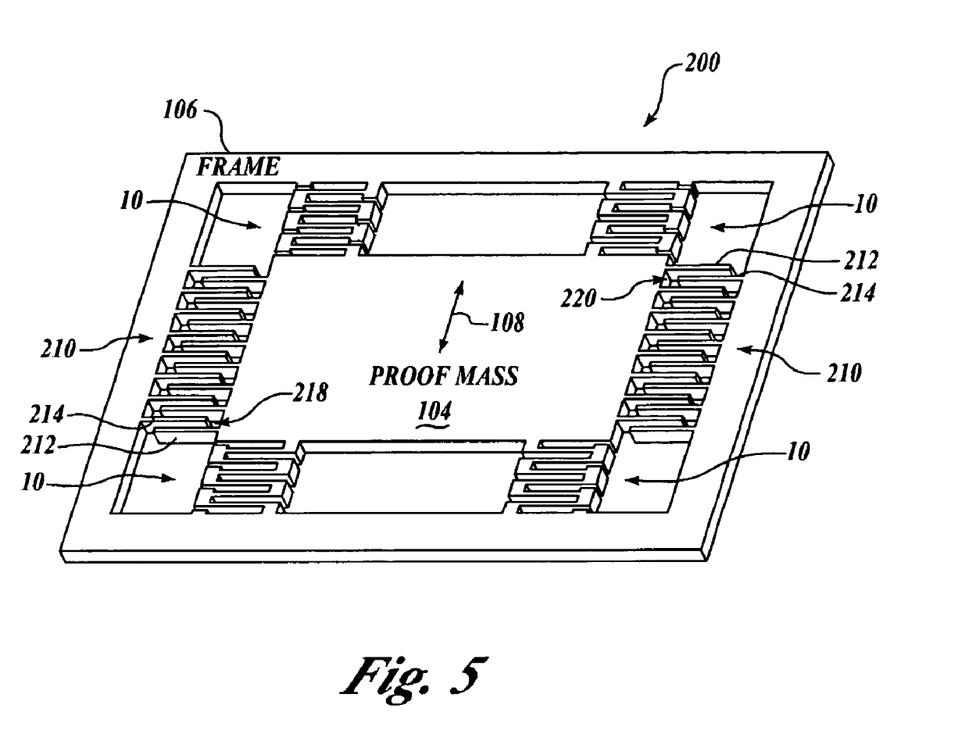
FIG. 5 illustrates the serpentine flexure of the invention embodied in an alternative single in-plane directional sensor.

FIG. 5 illustrates the invention embodied as an alternative single in-plane directional sensor 200 formed with a plurality of comb-type capacitive pickoff sensors 210 of a type that are well-known in the art and described, for example, by Biebl, et al. in U.S. Pat. No. 5,447,067, which is incorporated herein by reference. Accordingly, the micromechanical elements or features of the alternative single in-plane directional sensor 200 are etched out of the single-crystal silicon substrate 102 with the relatively movable reaction or proof mass 104 suspended in a balanced configuration at opposite ends from the fixed or stationary frame 106 by a plurality of the serpentine flexures 10, as described herein. The axis sensitivity of the sensor 200 lies in the plane of the silicon substrate 104, as indicated by the arrow 108.

The proof mass 104 is formed with a plurality of finger-shaped electrodes 212 which are doped so as to be electrically conductive. The electrodes 212 form a plurality of capacitors together with corresponding finger-shaped electrodes 214, 216, respectively disposed on opposite sides of each electrode 212 and connected to the stationary frame 106. Movement of the proof mass 104 in the plane of the silicon substrate 102 in response to an acceleration or other load applied perpendicular to the serpentine flexures 10, i.e., along the sensitive axis 108, causes a change in capacitance between one of the finger-shaped electrodes 212 on the proof mass 104 and one of the electrodes 214, 216 on the stationary frame 106 that are arranged next to the electrodes 212. The electrodes 214 on each side of the proof mass 104 are all electrically connected together, so as to form a group of capacitors 218 in combination with the electrodes 212. Similarly, all of the electrodes 216 on each side of the proof mass 104 are electrically connected together, thereby forming a second set of capacitors 220 in combination with the electrodes 212. A movement of the proof mass 104 in response to an applied acceleration or other applied load causes a shortening of the spacing between one set of proof mass electrodes 212 and frame electrodes 214 on one side of the proof mass 104, and simultaneously causes a lengthening of the spacing between the other set of proof mass electrodes 212 and frame electrodes 216 on the other side of the proof mass 104. The capacitors 218 on one side of the proof mass 104, therefore, all change their capacitance in the same direction given a movement of the proof mass 104, and the capacitors 220 on the other side of the proof mass 104 all change their capacitance in common in an opposite direction. The acceleration is a measure of the difference between the total capacitances of these two sets of capacitors 218, 220.

Figure 6:
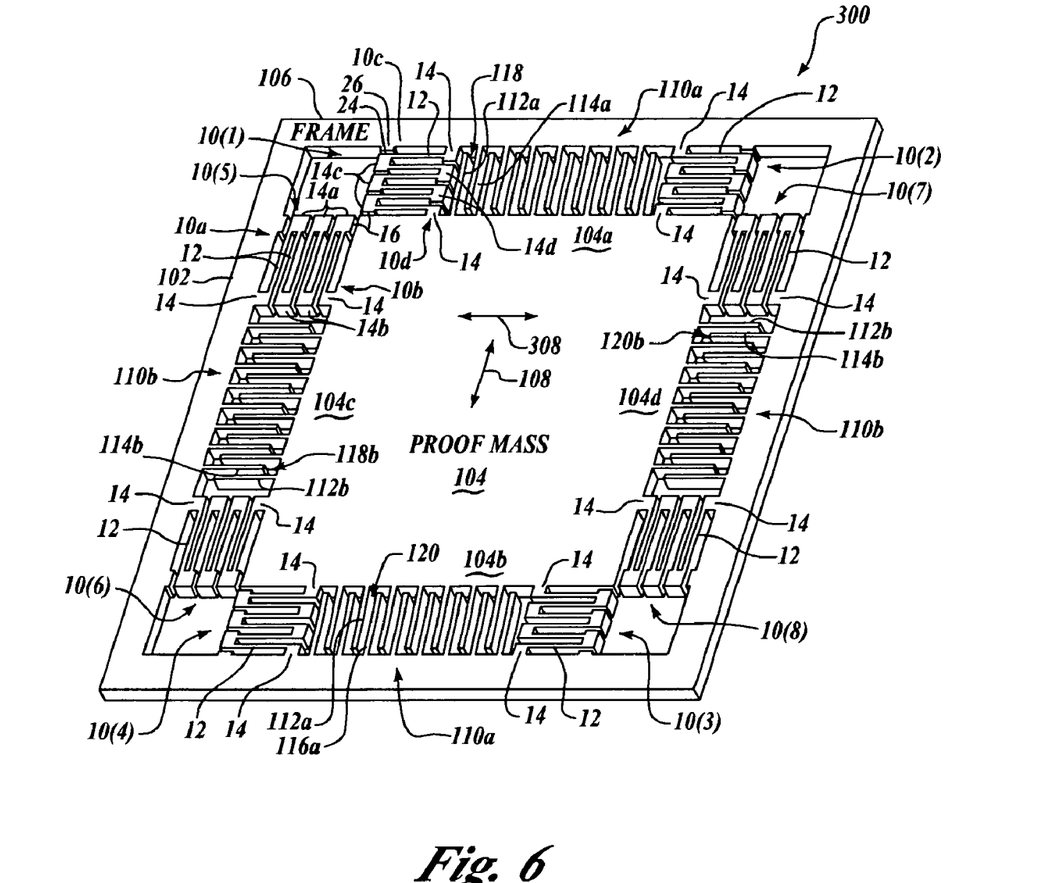
FIG. 6 illustrates the serpentine flexure of the invention embodied in a dual in-plane directional sensor.

FIG. 6 illustrates the invention embodied in a dual in-plane directional sensor 300 the micromechanical elements or features of which are etched out of the single-crystal silicon substrate 102. The relatively movable reaction or proof mass 104 is connected to the fixed or stationary frame 106 formed in the remaining portion of the silicon substrate 102 by two sets of the serpentine flexures 10 of the invention in a balanced configuration. A first set of serpentine flexures 10(1), 10(2) and 10(3), 10(4), collectively 10(1)–10(4), suspend respective opposite ends 104a, 104b of the proof mass 104 along the first axis sensitivity 108 of the sensor 300 that lies in the plane of the silicon substrate 104. A second set of serpentine flexures 10(5), 10(6) and 10(7), 10(8), collectively 10(5)–10(8), arranged 90 degrees from the first set 10(1)–10(4) suspend respective opposite ends 104c, 104d of the proof mass 104 along a second axis sensitivity 308 of the sensor 300 that lies perpendicular to the first axis sensitivity 108 in the plane of the silicon substrate 104.

As described herein, the serpentine flexure 10 includes a plurality of elongated flexure fingers 12 of substantially planar configuration arranged so that the thickness of the elongated flexure fingers 12, i.e., as measured along the sensor's sensitive axes 108, 308, is small in comparison to their length measured in the plane of the substrate crosswise to the sensitive axes 108, 308 and depth which is substantially that of the thickness of the substrate 102. The plurality of serpentine flexure 10 are arranged at the extreme outer edges, i.e., the corners, of the respective proof mass edges 104a, 104b and 104c, 104d in a balanced configuration in the gaps between the proof mass 104 and the frame 106. Each of the serpentine flexures 10(1)–10(4) and 10(5)–10(8) is integrally coupled to a respective outer proof mass edge 104a, 104b and 104c, 104d by one of the interconnected crosswise members 14 at one end of the last finger flexure 12 on one end of the respective serpentine flexures 10(1)–10(4) and 10(5)–10(8), and to an inner edge of the frame 106 by another one of the interconnected crosswise members 14 at a same end of the last finger flexure 12 on opposite end of the respective serpentine flexures 10(1)–10(4) and 10(5)–10(8).

The relative depth through the substrate 102 of the flexure fingers 12 causes the serpentine flexures 10(1)–10(4) and 10(5)–10(8) to exhibit relative out-of-plane stiffness crosswise to the respective sensitive axes 108, 308, as compared with the relative flexibility of the elongated flexure fingers 12 along the respective sensitive axes 108, 308 permit the flexures 10 to collapse or expand along the respective sensitive axes 108, 308, as described herein, whereby the proof mass 104 is moveable along the respective sensitive axes 108, 308 in response to an applied force, such as an acceleration. However, according to the embodiment of the invention as illustrated in FIG. 6, the flexure fingers 12 of one set of serpentine flexures 10(1)–10(4) resiliently collapse or expand along the corresponding first sensitive axis 108 in response to an acceleration or other load applied along the same sensitive axis 108. Simultaneously, the relative flexibility of the flexure fingers 12 permit the second set of serpentine flexures 10(5)–10(8) along the corresponding second sensitive axis 308 to collapse at one side 10a, while expanding at an opposite side 10b, by rotating about the respective short crosswise members 14a, 14b interconnecting alternate pairs of the elongated flexure fingers 12 at opposite ends thereof.

The embodiment of the invention illustrated in FIG. 6 is structured to respond in similar manner to an acceleration or other load applied along the second sensitive axis 308. Accordingly, the relative flexibility of the elongated flexure fingers 12 permit the second set of serpentine flexures 10(5)–10(8) to resiliently collapse or expand along the corresponding second sensitive axis 308 along which the load is applied. Simultaneously, the relative flexibility of the flexure fingers 12 permit the first set of serpentine flexures 10(1)–10(4) along the first sensitive axis 108 crosswise to the axis 308 along which the load is applied to collapse at one side 10c, while expanding at an opposite side 10d, by rotating about the respective short crosswise members 14c, 14d interconnecting alternate pairs of the elongated flexure fingers 12 at opposite ends thereof. The proof mass 104 is thus moveable along either of the sensitive axes 108, 308 in response to a force, such as an acceleration, applied along one of the respective sensitive axes 108, 308.

As described herein, the short extensions 16 on the ends of the short crosswise members 14a, 14b and 14c, 14d interconnecting alternate pairs of the elongated flexure fingers 12 internally cage the flexures 10(1)–10(4) and 10(5)–10(8) and limit the travel of the individual elongated finger flexures 12 so that their travel is sufficiently limited to avoid overstress of the elongated flexure fingers 12 and resulting damage.

Additionally, the respective outer edges 104a, 104b and 104c, 104d of the proof mass 104 or the inner edges the stationary frame 106 (shown) at the unconstrained ends 24 of the final flexure fingers 12 is formed with the small extension or promontory mass 26 that is sized to span a part of the distance between the inner frame edge and the final crosswise member 14 interconnecting the final pair of the elongated flexure fingers 12 for caging the flexures 10(1)–10(4) and 10(5)–10(8), as described herein.

According to one embodiment of the invention, when configured as an acceleration measurement device or accelerometer, the dual in-plane directional sensor 300 is formed with respective sets of the comb-type capacitive pickoff sensors 10a, 10b of the type that are well-known in the art and described herein. Accordingly, the proof mass 104 is formed with respective sets finger-shaped electrodes 112a, 112b arranged along the outer edges 104a, 104b and 104c, 104d so that their longitudinal directions extend along the respective sensitive axes 108, 308. Each of the sets of finger-shaped electrodes 112a, 112b is doped so as to be electrically conductive and form a capacitor in combination with a corresponding doped finger-shaped electrode 114a, 114b and 116a, 116b, which extend along the opposing inner edges of the frame 106 on respective opposite ends 104a, 104b and 104c, 104d of the proof mass 104 and are arranged so that their longitudinal directions extend along the respective sensitive axes 108, 308 and parallel with the respective sets of finger-shaped electrodes 112a, 112b extending from the proof mass.

All of the electrodes 114a are electrically connected to each other at one side 104a of the proof mass 104, and all of the electrodes 116a are electrically connected to each other at the other side 104b of the proof mass 104. First interdigital capacitors 118a, 120a are thus formed at each side 104a, 104b of the proof mass 104 between the set of finger-shaped proof mass electrodes 112a and each of the finger-shaped frame electrodes 114a, 116a respectively. So arranged, the first capacitors 118a, 120a and the respective first capacitances thereof change as a consequence of a change in the overlap of the conductor areas which occurs given a movement of the proof mass 104 along the first sensitive axis 108. This change in the capacitances ensues oppositely at the respective first capacitors 118a, 120a disposed at the opposite sides 104a, 104b of the proof mass 104. The two first capacitors 118a, 120a thus respectively change their capacitance in opposite directions given an acceleration of the substrate, and thus an excursion of the proof mass 104 in the plane of the silicon substrate 102 perpendicular to the longitudinal axes of the first resilient elongated finger flexures 12a of the first set of serpentine suspension flexures 10(1)–10(4). The acceleration along the first sensitive axis 108 is proportional to the difference between the capacitance changes of the two capacitors 118a, 120a, as discussed herein.

All of the electrodes 114b are electrically connected to each other at one side 104c of the proof mass 104, and all of the electrodes 116b are electrically connected to each other at the other side 104d of the proof mass 104. First interdigital capacitors 118b, 120b are thus formed at each side 104c, 104d of the proof mass 104 between the set of finger-shaped proof mass electrodes 112b and each of the finger-shaped frame electrodes 114b, 116b respectively. So arranged, the first capacitors 118b, 120b and the respective first capacitances thereof change as a consequence of a change in the overlap of the conductor areas which occurs given a movement of the proof mass 104 along the second sensitive axis 308. This change in the capacitances ensues oppositely at the respective first capacitors 118b, 120b disposed at the opposite sides 104c, 104d of the proof mass 104. The two first capacitors 118b, 120b thus respectively change their capacitance in opposite directions given an acceleration of the substrate, and thus an excursion of the proof mass 104 in the plane of the silicon substrate 102 perpendicular to the longitudinal axes of the second set of resilient elongated finger flexures 12b of the second set of serpentine suspension flexures 10(5)–10(8). The acceleration along the second sensitive axis 308 is proportional to the difference between the capacitance changes of the two capacitors 118b, 120b, as discussed herein.

According to one alternative embodiment of the invention, the first and second sets of electrodes 110a, 110b of the sensor 300 that measure capacitance as a function of a change in degree of overlap therebetween are instead configured as the finger-shaped electrodes 212 of FIG. 5 that measure capacitance as a function of a change in separation therebetween.

According to another alternative embodiment of the invention, the elongated flexure fingers 12 of which the first and second sets of serpentine flexures 10(1), 10(2), 10(3), 10(4) and 10(5), 10(6), 10(7), 10(8) a sufficiently thin in cross-section as to collapse in columnar mode as by S-bending when an acceleration or other load is applied to their respective sensitive axes 108, 308. The elongated flexure fingers 12 therefore do not operate in simple bending. Instead, the elongated flexure fingers 12 S-bend so that the free ends of translate under load applied along the corresponding sensitive axis 108, 308. Additionally, when loaded crosswise to one of their respective sensitive axes 108, 308, the elongated flexure fingers 12 of the respective first or second set of serpentine flexures 10(1), 10(2), 10(3), 10(4) and 10(5), 10(6), 10(7), 10(8) collapse lengthwise by S-bending so that the distance between the short cross members 14 on opposite ends of the flexure fingers 12 collapse each toward the other. The lengthwise collapse of the cross-axis set of serpentine flexures 10(1)–10(4) or 10(5)–10(8) permits motion of the proof mass 104 along the other sensitive axis 108 or 308 wherein the flexure fingers 12 collapse by S-bending toward or away from the frame 106 along the associated sensitive axis 108 or 308.

While the preferred embodiment of the invention has been illustrated and described, it will be appreciated that various changes can be made therein without departing from the spirit and scope of the invention.

What is claimed is:

1. A micro-machined electromechanical sensor (MEMS) device, comprising:
   a substantially planar proof mass suspended for in-plane motion from a relatively stationary frame by pluralities of first and second pairs of spaced-apart resiliently flexible elongated flexure members, wherein:
      each of the first pairs of elongated flexure members are interconnected at respective first ends, and adjacent pairs of the elongated flexure members are interconnected at respective second ends of adjacent elongated flexure members with respective second ends of first and last flexure members being interconnected between a first end of the proof mass and the frame, and
      each of the second pairs of elongated flexure members are interconnected at respective first ends, and adjacent pairs of the elongated flexure members are interconnected at respective second ends of adjacent elongated flexure members with respective second ends of first and last flexure members being interconnected between a second end of the proof mass and the frame;

a promontory mass formed between adjacent second pairs of the elongated flexure members on one end of a relatively short crosswise member interconnecting the respective first ends of one of the first pairs of the elongated flexure members; and one or more comb-type capacitive pickoff sensors formed between the proof mass and the frame and structured for changing capacitance as a function of a movement of the proof mass relative to the frame.

2. The device of claim 1, further comprising a promontory mass positioned between the frame and the relatively short crosswise member interconnecting the respective first ends of one of the first and second pairs of the elongated flexure members.

3. The device of claim 2 wherein the promontory mass is positioned at one end of the relatively short interconnecting member and extends a part of the distance between the relatively short interconnecting member and the frame.

4. The device of claim 2 wherein the promontory mass is positioned on the frame and extends a part of the distance between the relatively short interconnecting member and the frame.

5. The device of claim 1, further comprising a promontory mass positioned between one of the first and second ends of the proof mass and the relatively short crosswise member interconnecting the respective first ends of one of the first and second pairs of the elongated flexure members.

6. The device of claim 5 wherein the promontory mass is positioned at one end of the relatively short interconnecting member and extends a part of the distance between the relatively short interconnecting member and the proof mass.

7. The device of claim 5 wherein the promontory mass is positioned on the proof mass and extends a part of the distance between the relatively short interconnecting member and the proof mass.

8. The device of claim 1 wherein a spring rate of one or more of the flexures progressively changes between the proof mass and the frame.

9. A micro-machined electromechanical sensor (MEMS) device, comprising:

a substantially planar proof mass suspended for in-plane motion from a relatively stationary frame by pluralities of first and second pairs of spaced-apart resiliently flexible elongated flexure members, wherein:

each of the first pairs of elongated flexure members are interconnected at respective first ends, and adjacent pairs of the elongated flexure members are interconnected at respective second ends of adjacent elongated flexure members with respective second ends of first and last flexure members being interconnected between a first end of the proof mass and the frame, each of the second pairs of elongated flexure members are interconnected at respective first ends, and adjacent pairs of the elongated flexure members are interconnected at respective second ends of adjacent elongated flexure members with respective second ends of first and last flexure members being interconnected between a second end of the proof mass and the frame, and a spring rate associated with one of the elongated flexure members is different from a spring rate associated with a different one of the elongated flexure members;

a promontory mass formed between adjacent second pairs of the elongated flexure members on one end of a relatively short crosswise member interconnecting the respective first ends of a pair one of the first pairs of the elongated flexure members; and one or more comb-type capacitive pickoff sensors formed between the proof mass and the frame and structured for changing capacitance as a function of a movement of the proof mass relative to the frame.

10. The device of claim 9 wherein the proof mass, frame and flexure members are formed between substantially parallel and planar spaced-apart surfaces of a silicon substrate.

11. The device of claim 9, further comprising a promontory mass positioned between the frame and the relatively short crosswise member interconnecting the respective first ends of one of the first and second pairs of the elongated flexure members.

12. The device of claim 9, further comprising a promontory mass positioned between one of the first and second ends of the proof mass and the relatively short crosswise member interconnecting the respective first ends of one of the first and second pairs of the elongated flexure members.

13. A micro-machined electromechanical sensor (MEMS) device, comprising:

a silicon substrate having substantially parallel and planar spaced-apart surfaces;

a proof mass formed in the substrate;

a frame formed in the substrate surrounding the proof mass;

a plurality of capacitive pickoff sensors formed between the proof mass and the frame and structured for changing capacitance as a function of an in-plane movement of the proof mass relative to the frame;

a plurality of serpentine flexures formed in balanced configuration between the proof mass and the frame and structured for enabling the in-plane movement of the proof mass relative to the frame, one or more of the serpentine flexures comprising a plurality of substantially parallel and spaced-apart resiliently flexible elongated flexure members that are arranged substantially crosswise to a direction of the in-plane movement of the proof mass relative to the frame and are interconnected at opposite ends of alternate pairs of the elongated flexure members;

a plurality of relatively short interconnecting members arranged crosswise to the longitudinal axes of the elongated flexure members and interconnecting opposite ends of alternate pairs of the elongated flexure members in a serpentine configuration; and a promontory mass formed between the serpentine flexures, the promontory mass being positioned at one end of one or more of the relatively short interconnecting members and being sized to span a part of the distance between adjacent elongated flexure members.

14. The device of claim 13 wherein a spring rate of one or more of the serpentine flexures progressively changes between the proof mass and the frame.

15. A micro-machined electromechanical sensor (MEMS) device having a serpentine flexure, the device comprising:

a relatively stationary frame formed in a substrate having substantially parallel and planar spaced-apart surfaces;

a moveable proof mass that is formed in the substrate; and a plurality of serpentine flexures suspending the proof mass from the frame, one or more of the serpentine flexures comprising:

a plurality of elongated flexure members each formed in the substrate between the spaced-apart surfaces thereof, a relatively short interconnecting member arranged crosswise to the longitudinal axes of the elongated flexure members and interconnecting opposite ends of alternate pairs of the elongated flexure members in a serpentine configuration, and a small mass formed as an extension formed on one end of one or more of the interconnecting members and extending a part of a distance between adjacent elongated flexure members.

16. The device of claim 15, further comprising a small mass extending a part of a distance between one of the frame and the proof mass and one of elongated flexure members that is adjacent thereto.

17. The device of claim 15, further comprising a plurality of capacitive pickoff sensors formed between the proof mass and the frame.

18. A micro-machined electromechanical sensor (MEMS) device having a serpentine flexure, the device comprising:

a relatively stationary frame formed in a substrate having substantially parallel and planar spaced-apart surfaces;

a moveable proof mass that is formed in the substrate; and a plurality of serpentine flexures suspending the proof mass from the frame, one or more of the serpentine flexures comprising:

a plurality of elongated flexure members each formed in the substrate between the spaced-apart surfaces thereof, a relatively short interconnecting member arranged crosswise to the longitudinal axes of the elongated flexure members and interconnecting opposite ends of alternate pairs of the elongated flexure members in a serpentine configuration, and a small mass formed as an extension formed on each of two opposite ends of one or more of the interconnecting members and extending a part of a distance between adjacent elongated flexure members.

19. A micro-machined electromechanical sensor (MEMS) device having a serpentine flexure, the device comprising:

a relatively stationary frame formed in a substrate having substantially parallel and planar spaced-apart surfaces;

a moveable proof mass that is formed in the substrate; and a plurality of serpentine flexures suspending the proof mass from the frame, one or more of the serpentine flexures comprising:

a plurality of elongated flexure members each formed in the substrate between the spaced-apart surfaces thereof wherein a spring rate of one or more of the serpentine flexures progressively changes between the proof mass and the frame, and a small mass extending a part of a distance between adjacent elongated flexure members.

20. The device of claim 19 wherein one or more of the plurality of elongated flexure members is thicker than one or more others of the elongated flexure members.

* * * * *